United States Patent
Van Wijck

(10) Patent No.: US 6,585,823 B1
(45) Date of Patent: Jul. 1, 2003

(54) ATOMIC LAYER DEPOSITION

(75) Inventor: Margreet Albertine Anne-Marie Van Wijck, Oldebroek (NL)

(73) Assignee: ASM International, N.V., Bilthoven (NL)

( * ) Notice: Subject to any disclaimer, the term of this patent is extended or adjusted under 35 U.S.C. 154(b) by 0 days.

(21) Appl. No.: 09/611,536

(22) Filed: Jul. 7, 2000

(51) Int. Cl.[7] ............................................. C30B 25/16
(52) U.S. Cl. .................. 117/89; 117/101; 117/105; 118/719; 118/723; 118/725
(58) Field of Search .................. 117/101, 89, 105; 118/719, 723, 725

(56) References Cited

U.S. PATENT DOCUMENTS

| | | | | |
|---|---|---|---|---|
| 5,281,274 A | * | 1/1994 | Yoder | ........................ 118/719 |
| 5,711,811 A | * | 1/1998 | Suntola et al. | ............... 118/711 |
| 5,879,459 A | * | 3/1999 | Gadgil et al. | ................ 118/715 |
| 6,174,377 B1 | * | 1/2001 | Doering et al. | ............. 118/729 |

FOREIGN PATENT DOCUMENTS

WO    WO 99/28527    6/1999

* cited by examiner

*Primary Examiner*—Robert Kunemund
(74) *Attorney, Agent, or Firm*—Knobbe, Martens, Olson & Bear, LLP

(57) ABSTRACT

Atomic layer deposition is used to provide a solid film on a plurality of disc shaped substrates. The substrates are entered spaced apart in a boat, in a furnace and heated to deposition temperature. In the furnace the substrate is exposed to alternating and sequential pulses of at least two mutually reactive reactants, in such way that the deposition temperature is high enough to prevent condensation of the at least two reactants on the surface but not high enough to result in significant thermal decomposition of each of the at least two reactants individually.

12 Claims, 4 Drawing Sheets

ATOMIC LAYER DEPOSITION

FIELD OF THE INVENTION

The present invention relates to a method for the deposition of a thin film onto a substrate by the technique of Atomic Layer Deposition.

BACKGROUND OF THE INVENTION

In the technique of Atomic Layer Deposition a substrate is exposed sequentially and alternately to at least two mutually reactive reactants. The substrate is heated to a temperature that is high enough to prevent condensation of the reactants but low enough to prevent thermal decomposition of each of the reactants. The substrate is exposed to the first reactant and the first reactant is chemisorbed onto the surface of the substrate until the surface is occupied with a monolayer of the first reactant. Then the chemisorption saturates and excess reactant is exhausted. Then the supply of the first reactant is cut-off and the reaction chamber is evacuated and/or purged to remove the traces of non-chemisorbed first reactant from the gas phase. Then the substrate is exposed to the second reactant which reacts with the chemisorbed first reactant under the formation of a solid film and the release of gaseous reaction products until the monolayer of the first reactant has fully reacted with the second reactant and the surface of the substrate is covered with a chemisorbed monolayer of the second reactant. Then the process saturates and excess of the second reactant is exhausted. This cycle can be repeated a number of times until a sufficiently thick film has been deposited onto the substrate. More than two reactants can be used, in particular for the deposition of ternary or more complicated compounds or multilayers. This technique has been know since 1980, see the review article of Suntola, "Atomic Layer Epitaxy" in: "Handbook of Christal Growth 3, Thin Films and Epitaxy, part B. Growth Mechanisms and Dynamics", by D. T. J. Hurle, Ed. Elsevier, 1994, Chapter 14, p 601–663. Because only a monolayer of the material is deposited per cycle, a sufficient number of cycles needs to be executed to achieve the required film thickness. In order to minimize the cycle time without compromising the effectiveness of the purging of the reactor, the volume of the reactor has been minimized and the flow dynamics of the reactor has been optimized.

A first example of a reactor is given in U.S. Pat. No. 5,711,811 which is incorporated herein by reference. This patent describes a reactor in which a plurality of substrates can be processed simultaneously. In this reactor, a stack of narrowly spaced substrates is formed and the direction of the gas flow is parallel to the main surfaces of the substrates, an inlet located at one side of a substrate surface and the exhaust located at the other side of the substrate surface. Although it is an advantage that a plurality of substrates can be processed simultaneously, making the relatively slow technique more economical, it is a disadvantage that the formation of the stack of substrates needs to be carried out manually. In Finnish patent application 991078 of Microchemistry Oy a single wafer reactor for Atomic Layer Deposition is described which allows robotic loading and unloading of the substrate. The disadvantage of this reactor is that only one wafer is processed at a time, using the relatively slow Atomic Layer Deposition technique.

It is the object of the present invention to overcome these disadvantages and provide a method for operating the Atomic Layer Deposition technique that allows batch processing and robotic handling of the wafers.

SUMMARY OF THE INVENTION

In accordance with one aspect of the invention, the Atomic Layer Deposition process is operated in a vertical hot wall LPCVD batch reactor. In such a reactor the lower end of the vertically elongated reaction chamber is provided with an opening for insertion and removal of a boat wlich comprises a number of mutually spaced supports to support the substrates in the horizontal orientation and wherein the stack of mutually spaced substrates extends in the vertical direction. The reaction chamber is provided with at least one reactant inlet and a reactant exhaust so that a flow in the vertical direction is created. In the vertical direction the transport of reactants is determined by forced convective gas flow from the inlet end of the reactor towards the exhaust end of the reactor. In the narrow gap between the substrates, the transport of reactants is determined by diffusion. This occurs at a slower rate than the transport in the vertical direction. However, because of the large number of substrates, typically 50 to 200, cycle times which are an order of magnitude larger than the cycle times in a single wafer reactor can easily be accepted.

In normal Atomic Layer Deposition enough reactant needs to be supplied to saturate all the available surface sites with reactant. In the method of the present invention, in addition to this requirement, the supplied reactant should be given the opportunity to distribute itself over the whole batch of wafers. To this end the present invention proposes to supply the reactant, eventually mixed with an inert gas like nitrogen, at one end of the reaction chamber while pumping at the other end of the reaction chamber such that during the period of supply of the reactant the volume of the reaction chamber is replaced a sufficient amount of times to reach even distribution but not so often that the required time per pulse becomes uneconomically long. Therefore it is proposed to replace the volume of the reactor during the period of supply of the reactant at least one time to a maximum of 50 times, taken into account the average pressure in the reaction chamber during the period of supply of the reactant.

In a preferred embodiment it is proposed that during the time in between successive reactant pulses the reactor is evacuated and at least during part of this time an inert gas is fed into the reactor to drive the previous reactant pulse out of the annular space of the reactor while additionally during part of this time a pressure in the reactor is lower than the average pressure during the reactant exposure to allow diffusion of the reactant out of the narrow gap between the substrates.

In an alternative embodiment, following the Atomic Layer Deposition treatment, the substrate is possibly heated to a second temperature and reactants for a chemical vapor deposition process are introduced into the reactor. After completion of the deposition by chemical vapor deposition the supply of reactants is cut off and after evacuating and/or purging the reaction chamber and when required backfilling it to atmospheric pressure, the substrate is removed from the reaction chamber.

DETAILED DESCRIPTION OF THE INVENTION

Figure 1:
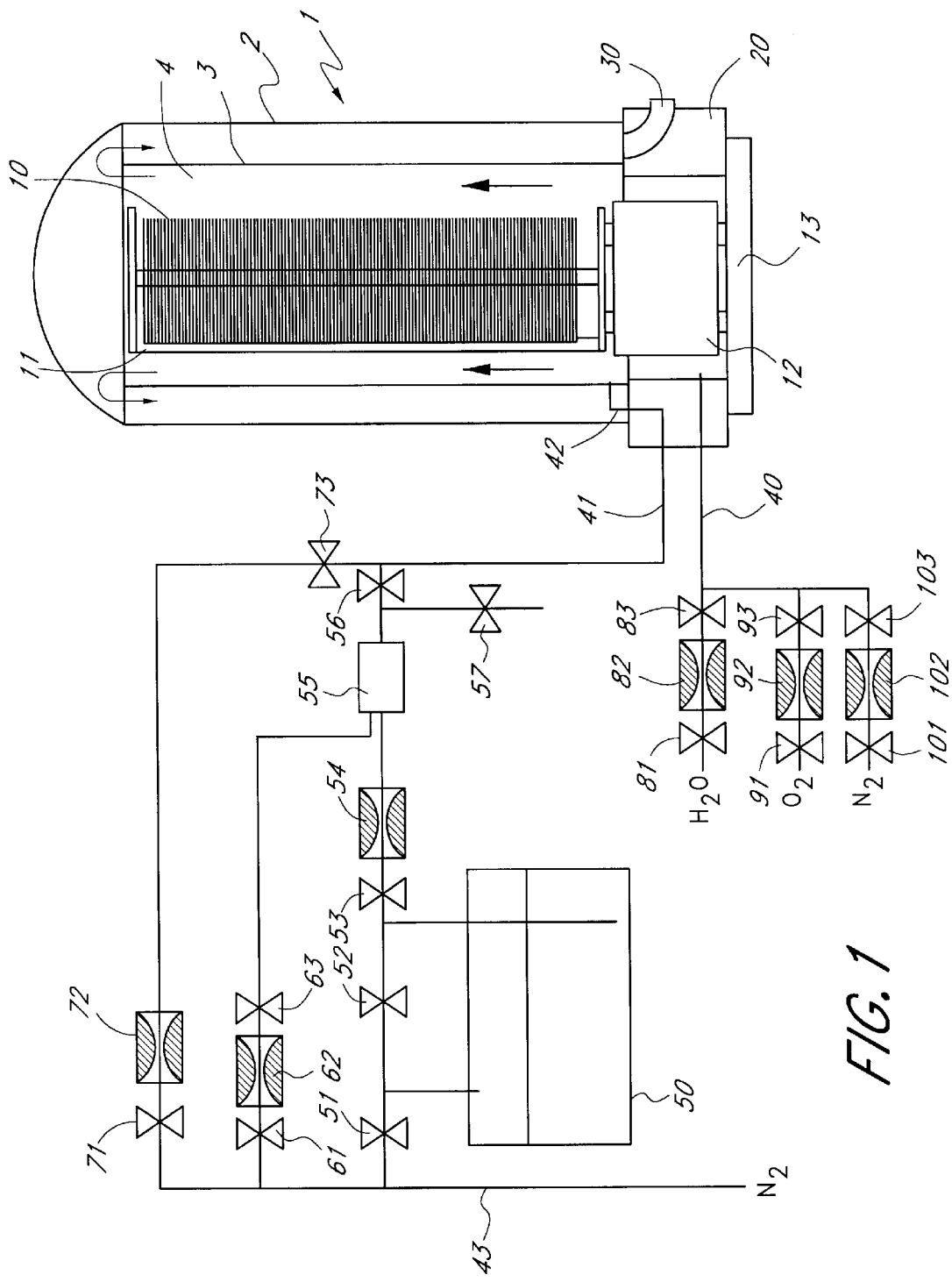
FIG. 1 is a schematic view of a furnace and gas lines connected thereto, constructed in accordance with the preferred embodiment of the present invention.

FIG. 1 gives a schematical presentation of a gas system and furnace utilized for an embodiment of the invention for the purpose of tantalum oxide deposition. The furnace in its entirety is indicated by 1, the process tube by 2 and an inner liner by 3, which inner liner 3 delimits a reaction chamber 4. The process tube 2 is surrounded by a heating element, not shown. A plurality of wafer like substrates 10 is placed in a holder 11, which holder 11 is supported by a pedestal 12. The holder 11 comprises at least three vertical columns, at the upper and lower ends attached to respectively an upper and lower plate, as will be appreciated by the skilled artisan. Each of the columns is thereby provided with mutually spaced recesses to receive the edge of the substrates. This holder 11 is inserted and removed into and out of the reaction chamber 4, together with the wafers, by a lift mechanism.

The pedestal is supported by a doorplate 13 which closes the reaction chamber 4. The process tube 2 and inner liner 3 arc supported by a flange 20. Gas is injected into the process chamber 4 by gas supply lines 40 and 41, either directly or via a gas injector 42. The gas is exhausted via the gap between inner liner 3 and process tube 2, through the gas exhaust line 30 towards the pump (not shown). A container with one reactant, comprising tantalum penta ethoxide 50 in the illustrate embodiment, is connected to a nitrogen supply line 43 to be able to put the liquid source material under pressure. The flow of liquid source material is measured by liquid flow meter 54. In vaporizer unit 55 the flow of liquid source material is controlled, mixed with an inert gas, preferably nitrogen, and vaporized. The vaporized flow is fed into the gas supply line 41 by opening valve 56. Alternatively, before and after feeding the vaporized flow into the reactor, the flow can be directed towards the pump (not shown) by opening valve 57 while valve 56 is closed. The flow of nitrogen to the vaporizer unit 55 is controlled by mass flow controller 62 whereas mass flow controller 72 controls a flow of nitrogen directly fed into the gas supply line 41. Mass flow controllers 82, 92 and 102 control the flows of respectively $H_2O$, $O_2$ and $N_2$, fed into the reactor via gas supply line 40. Pneumatically operated shut-off valves 61, 71, 81, 91 and 101 provide means to isolate the respective mass flow controllers from the gas supply lines at the upstream side and pneumatically operated valves 63, 73, 83, 93 and 103 provide in means to isolate the mass flow controllers at the downstream side. Shut-off valve 51 can isolate the tantalum penta ethoxide container 50 from the nitrogen supply line 43. Closing shut-off valve 53 interrupts the liquid tantalum penta ethoxide flow and opening valve 52 allows purging of the liquid flow controller 54 by $N_2$.

Figure 2:
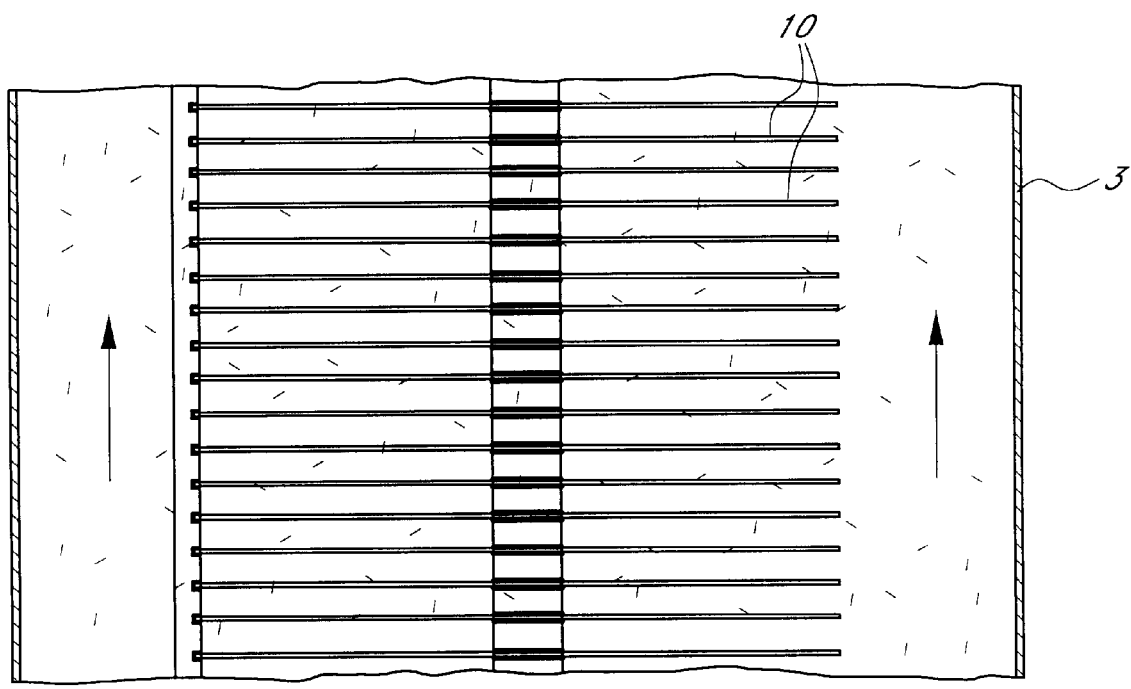
FIG. 2 is a detailed cross-section through part of the reaction chamber shown in FIG. 1, with wafers loaded therein.
Figure 3A:
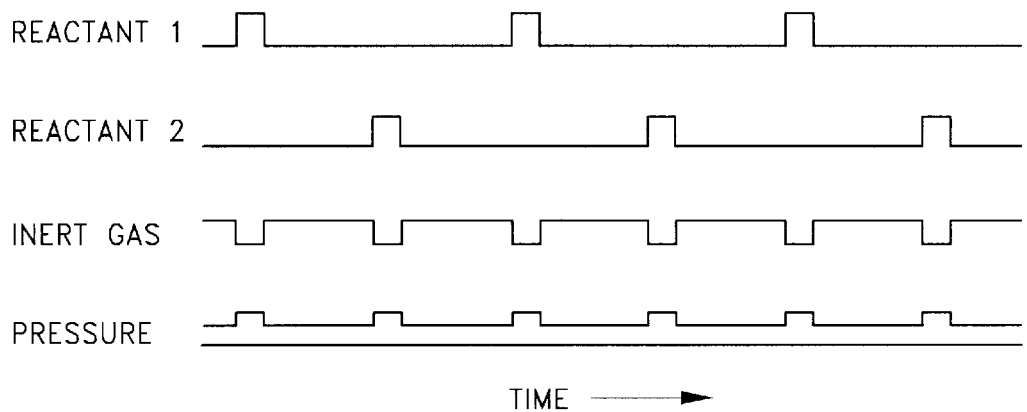
FIGS. 3a to 3d are graphs showing flows and pressure as a function of time.
Figure 3B:
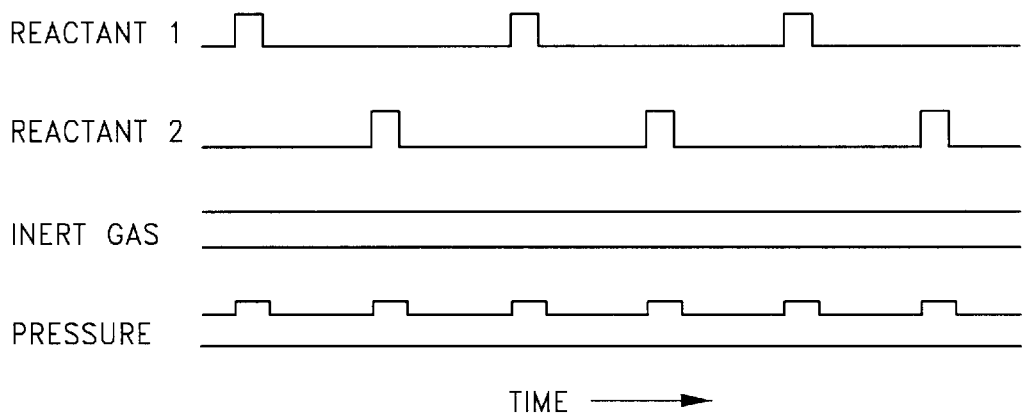
Figure 3C:
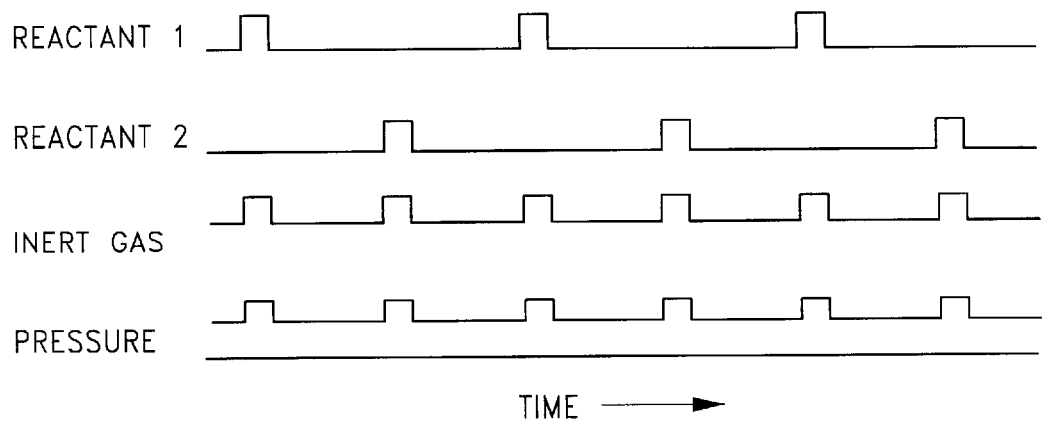
Figure 3D:
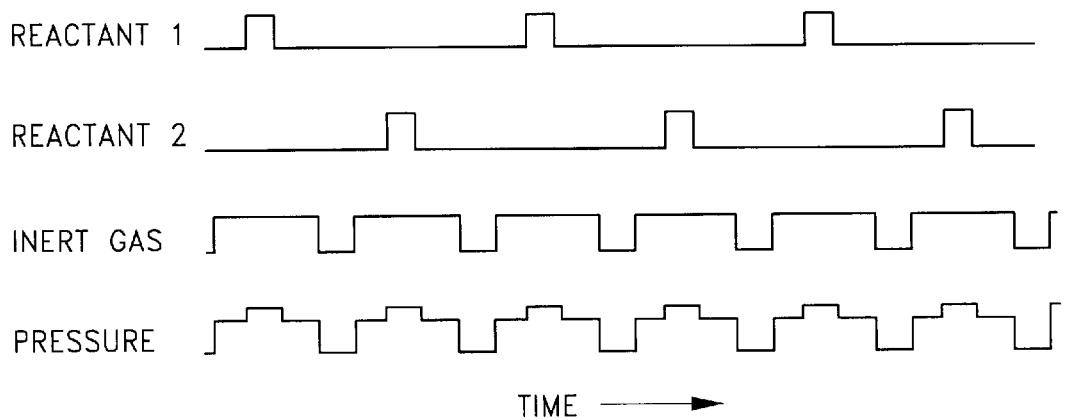

In FIG. 2, the gas flow geometry and wafer mounting are shown in more detail, Between the circumference of the circular wafer and the inner diameter of the inner liner is an annular space. Gas is transported in this annular space by means of forced convection. In the spacing between the wafers, gas transport occurs by diffusion, In FIG. 3, examples of sequences of gas flows and of the corresponding pressure in the process tube as a function of time are presented. In a first example, presented in FIG. 3a, an inert gas flow is fed into the reactor in between the successive reactant pulses to drive the previous reactant pulse out of the reaction chamber. Although evacuation alone will remove the reactant from the reaction chamber, the concentration of the reactant will decrease with time roughly according to an exponential curve. In the initial stage the removal of the reactant from the chamber is efficient but in the exponential tail the removal is inefficient. The inert gas flow during the evacuation is instrumental in rapidly expelling this exponential tail. By selecting the inert gas flow and/or the pump capacity such that the pressure during the inert gas flow is lower than the pressure during the reactant pulses, the reactant can more easily diffuse out of the gap between the wafers towards the annular space where it is transported by convective flow towards the exhaust. Typically, also an inert gas flow will be applied during the flow of the reactant because it serves as a carrier gas for the reactant. FIGS. 3b–d shows three examples. A particularly preferred embodiment is shown in FIG. 3d where between the reactant pulses part of the time an inert gas flow is present and during part of the time no inert gas flow is present. In this way the advantages of both situations are exploited to the fill extend: the inert gas flow to drive the reactant out of the annular space and a very low pressure to promote diffusion of the reactant out of the gap between the wafers. The interruption of the $N_2$ flow in between successive reactant pulses can be applied more than once in order to achieve a very efficient "cycle purging".

EXAMPLE 1

A specific example of a process in accordance with the invention is the following. After inserting a holder containing a plurality of substrates into a hot wall batch reactor the substrates are heated to 220° C. As a first reactant, Tantalum Pentaethoxide (TAETO,=Ta—(O—$C_2H_5$)$_5$) mixed with nitrogen is admitted into the reactor while pumping at the exhaust end of the reactor and maintaining a pressure of 1 Torr. The temperature of the vessel containing the (TAETO) is maintained at 35° C. A nitrogen pressure is applied to the vessel and a flow of liquid TAETO corresponding to a vapor flow of 9 sccm, is fed from the vessel into an evaporator. A flow of nitrogen of 500 sccm is also fed into the evaporator. TAETO vapour, together with the nitrogen gas flow, is fed from the evaporator into the reactor. The duration of the TAETO exposure is 2 min. After cut-off of the TAETO supply, the reactor is purged for 2 minutes with approximately 500 sccm $N_2$, the $N_2$ flow is interrupted for 30 seconds while the evacuation is continued and the $N_2$ flow is switched on again for 2 minutes. Then a flow of water vapor of 500 sccm is supplied to the reactor during 2 minutes, followed by a purge/evacuate/purge sequence. This whole cycle is repeated a number of times, according to the required film thickness. Finally, the reaction chamber is purged/evacuated, the chamber backfilled to 1 atm. if required, and the holder with wafers is unloaded from the reaction chamber.

In an advantageous embodiment, during the supply of the TAETO via injector 42, a nitrogen flow is fed into the reactor via line 40, preventing the upstream diffusion of the TAETO vapor to the relatively cool flange (20) and door plate (13) where it could give rise to loosely adhering deposits, flaking and particles.

What is claimed is:

1. A method for atomic layer deposition of a solid film onto a plurality of substrates comprising:
   placing said plurality of substrates in a holder, the holder having at least three vertical columns, wherein upper ends of the columns are attached to an upper plate and lower ends of the columns are attached to a lower plate, wherein each column has mutually spaced recesses to receive an edge of the substrates so that the substrates are vertically spaced apart and rest substantially horizontally in the holder;

inserting the holder with said plurality of substrates in a spaced apart relationship and substantially horizontal position in a reaction chamber delimited by a liner;

heating the substrates to a deposition temperature;

exposing the substrate to alternating and sequential pulses of at least two mutually reactive reactants, wherein the deposition temperature is high enough to prevent condensation of the reactants on a surface but not high enough to result in a significant thermal decomposition of the reactants individually, said exposing includes flowing the reactants in an annular passage defined between the liner and edges of the substrates in a direction substantially perpendicular to a major surface of the substrates; and removing the holder with said plurality of substrates from the reaction chamber.

2. A method according to claim 1, wherein said holder holds at least 50 substrates.

3. A method according to claim 1, further comprising, after atomic layer deposition, subjecting the substrates to a chemical vapor deposition method for deposition of a further film on said solid film in the reaction chamber.

4. A method according to claim 1, further comprising evacuating the reaction chamber during a period of supply of a reactant, wherein the period of supply is long enough that during this period a volume of the reaction chamber is refreshed by the reactant one to 50 times, taking into account an average pressure inside the reaction chamber during the period of supply of the reactant.

5. A method according to claim 1 further comprising evacuating the reaction chamber during a period of evacuation between the reactant pulses while a flow of inert gas is fed into the reaction chamber, wherein during at least a part of the period of evacuation an evacuation pressure in the reaction chamber is lower than an average pressure in the reaction chamber during a period of supply of the reactant.

6. A method according to claim 5, wherein during part of the period of evacuation an inert gas flow is at a high level and during part of the period of evacuation the inert gas flow is at a low level.

7. A method according to claim 1, wherein during injection of the reactants an inert gas is injected into the reaction chamber at a protective injection point located upstream from a reactant injection point.

8. A method according to claim 1, wherein the deposited film is tantalum oxide.

9. The method of claim 1 wherein said exposing the substrates to alternating and sequential pulses comprises exposing each side of the substrates to said pulses.

10. A method of depositing a solid film on a plurality of wafer-like substrates utilizing atomic layer deposition, said method comprising the steps of:

placing said substrates in a holder in substantially vertically spaced relation with the substrates extending substantially horizontally with peripheral edges of the substrates forming circumferential passages leading to gaps between the substrates;

inserting the holder with the substrates into a reaction chamber with the peripheral edges of the substrates being spaced from a surrounding wall of the reaction chamber to form an annular, vertically extending passage;

heating the substrates to a deposition temperature;

exposing the substrates to alternating and sequential pulses of at least two mutually reactive reactants, wherein said exposing step comprises flowing the reactants vertically through the annular passage, to an exhaust line, while permitting reactants to migrate into the gaps between said substrates, said deposition temperature being high enough to prevent condensation of the reactants on the surface but not high enough to result in a significant thermal decomposition of the reactants individually; and removing the holder with said substrates from the reaction chamber.

11. The method of claim 10 including the step of injecting said reactants into one end of the reactant chamber and flowing from said passage to the reactants through an opposite end of said chamber.

12. The method of claim 10 further comprising, after atomic layer deposition, subjecting the substrates to a chemical vapor deposition method for deposition of a further film on said solid film in said reaction chamber.

* * * * *